United States Patent [19]

Schaffer

[11] 4,138,649
[45] Feb. 6, 1979

[54] AMPLIFIER SYSTEM

[75] Inventor: Gregory L. Schaffer, Del Mar, Calif.

[73] Assignee: Emerson Electric Co., St. Louis, Mo.

[21] Appl. No.: 781,151

[22] Filed: Mar. 25, 1977

[51] Int. Cl.² ............................................. H03F 1/02
[52] U.S. Cl. .......................................... 330/9; 330/51;
    330/69; 330/303
[58] Field of Search ...................... 330/9, 51, 69, 149,
    330/303

[56] References Cited
U.S. PATENT DOCUMENTS

| 2,801,296 | 7/1957 | Blecher | 330/9 |
| 3,697,891 | 10/1972 | Shade | 330/9 |
| 3,892,196 | 9/1976 | Poujois | 330/9 |
| 4,048,574 | 9/1977 | Barbier et al. | 330/9 |

Primary Examiner—Lawrence J. Bahl
Attorney, Agent, or Firm—Polster, Polster and Lucchesi

[57] ABSTRACT

A low-level dc amplifier includes a first amplification stage having a pair of direct coupled inputs and a pair of outputs direct coupled to the input side of a second amplifier. A first double-pole, double-throw electronic switch interchanges the two first stage inputs synchronously with a second such switch which interchanges the two first stage outputs. The switches produce at the input of the second amplifier a signal which averages out the first stage's equivalent offset signal. A clock drives the two switches at a preselected clocking frequency. The two clock-driven switches effectively cancel out low frequency (1/f) noise. A filter at the output side of the second amplification stage removes higher frequency noise including clock frequency noise.

15 Claims, 4 Drawing Figures

AMPLIFIER SYSTEM

BACKGROUND OF THE INVENTION

This invention relates to high performance amplifier systems, and has particular application to systems for amplifying slowly changing low-level signals. Such amplifiers are in wide use, for example in measurement instruments having transducers which produce low-level voltages indicative of a condition being monitored.

Many problems must be overcome in building a high performance, low-level amplifier system. These include minimizing offset voltage (the differential voltage which must be applied at the input terminals of the amplifier to produce a zero volt output), minimizing noise (short term variations in the offset voltage), and minimizing drift (long term variations in the offset voltage with time and temperature).

Presently known high performance amplifier systems generally include an operational amplifier and a first (input) gain stage for amplifying information signals applied to the input of the amplifier system and applying them, in amplified form, to the input terminals of the operational amplifier. The first stage is typically, but not necessarily, a differential amplifier. Because the signals received by the first stage are very weak, and because the first stage has a substantial gain, the absolute offset, noise and drift of the input stage are far more significant for overall amplifier system performance than are these characteristics of the operational amplifier stage.

One way to reduce offset, noise and drift is by using closely matched (sometimes laser trimmed) transistors in the input stage of the system. An example of this approach is described in an article by Diamond and Siefert, Electronics, June 21, 1971, pages 76–80. This approach however, does not improve performance sufficiently for many applications. A particular problem, even with this approach, is that the noise component is not uniform with frequency. Instead, the noise contribution for a given bandwidth tends to rise below a corner frequency. This noise is commonly called "1/f noise" since it increases as frequency decreases. Since most low level amplifiers are used to amplify dc or slowly varying low-level signals, 1/f noise can become the dominating error term in a low-level amplifier.

To achieve adequate performance for low signal level applications, far more complex systems are presently required. A first such system is the so-called "chopper stabilized amplifier" system. Chopper stabilized amplifier systems are described for example, in Burr Brown Research Corporations' "Operational Amplifiers: Design and Applications" (1971) at pages 150–160, and a modern version is described in Electronic Design, Aug. 2, 1976, page 78. Briefly, a chopper stabilized amplifier system chops the dc input signal (e.g., by periodically switching between two signals) to generate an ac signal. The ac signal is coupled to a first amplifier, amplified, and then demodulated to a dc signal which is filtered and further amplified by a second amplifier. Because of the ac coupling, there is no offset voltage from the input stage. A chopper stabilized amplifier system is also particularly effective in reducing long-term drift. Such a system, however, suffers from drawbacks which go beyond its complexity and expense. Switching spikes generally introduce small offsets. Furthermore, the system's requirement for at least one large capacitor at the output side of the ac coupled first stage makes the circuit difficult or impossible to fabricate as a single semiconductor integrated circuit.

A second high performance amplifier system, sometimes also referred to as a chopper amplifier system, periodically shorts the input leads and amplifies the resulting offset signal. The offset signal is stored by a sample and hold circuit for use as a correction factor during the period that the input leads are not shorted. This second type of chopper circuit has been integrated on a semiconductor chip, but its performance is generally not as good as the first type. This second type of chopper circuit is described, for example, in Aumiaux, U.S. Pat. No. 3,748,587 (1973) and Johnson, U.S. Pat. No. 3,681,703 (1972).

Both types of chopper circuits are dependent on the switching circuit for their operation. If the clock stops, the amplifier system locks up. Further, both are dependent on capacitors for their operation and thus have a substantial recovery period if they are overloaded.

SUMMARY OF THE INVENTION

One of the objects of this invention is to provide an extremely high performance amplifier system.

Another object is to provide such an amplifier system which greatly reduces offset voltage, low-frequency noise and drift.

Another object is to provide such a system which is simple, which may utilize low cost components, and which may be integrated on a semiconductor chip.

Another object is to provide such an amplifier system which is not dependent on the fed back signal to minimize offset voltage, low frequency noise and drift.

Another object is to provide such a system which recovers essentially instantaneously from overload and which continues to operate, albeit less accurately, when a clock portion of the system fails.

Another object is to provide such a system which is adaptable to a variety of operational amplifier configurations and applications.

Other objects will become apparent to those skilled in the art in the light of the following description.

In accordance with this invention, generally stated, an amplifier system is provided which produces a first output signal containing an amplified information signal component plus an offset component, and a second output signal containing the information signal component minus the offset component. Averaging means receive the first and second signals and produce an output signal proportional to their sum, thereby canceling the offset component. Preferably, the averaging means comprise clock means which alternately apply the first amplified signal and the second amplified signal to an output device for equal periods, so that the total signal applied to the output device has an average value equal to the signal component. Also preferably, the first and second amplified signals are generated by a pair of double-pole, double-throw switches, one of which interchanges the inputs of a differential amplifier and the other of which synchronously interchanges the outputs of the amplifier. In the preferred embodiments, the system is an operational amplifier system, in which the switches are arranged on the input and output sides of an input amplifier (gain stage). In a preferred non-inverting operational amplifier system, the switch on the input side of the differential gain stage interchanges an information signal input and a fed-back signal input, and the switch on the output side of the gain stage interchanges the outputs of the gain stage (the inputs of the second amplifier). The second amplifier is followed by a filter which has a roll-off (cut-off) frequency substantially below the repetition frequency of the clock means. The clock typically has a repetition rate of from 100 to 1000 hertz. The filter removes high frequency offset components, including amplifier and clock noise, and averages the signal applied to it at the clock frequency. Low frequency noise and offset voltage are substantially reduced in the averaging process. The filter may be an integral component of the amplifier system, or it may be a part of the output load. For example, if the amplifier system drives a microammeter, the microammeter itself acts as a filter.

In another configuration of the amplifier system of this invention, the input gain stage of the operational amplifier system has a single output terminal, and a fixed reference voltage serves as the other output of the gain stage.

In an integrator configuration, filtering is performed by the integration capacitor, and a counter is utilized to ensure that equal numbers of first and second output signals have been applied to the integrator when its value is read.

DESCRIPTION OF THE PREFERRED EMBODIMENT

Figure 1:
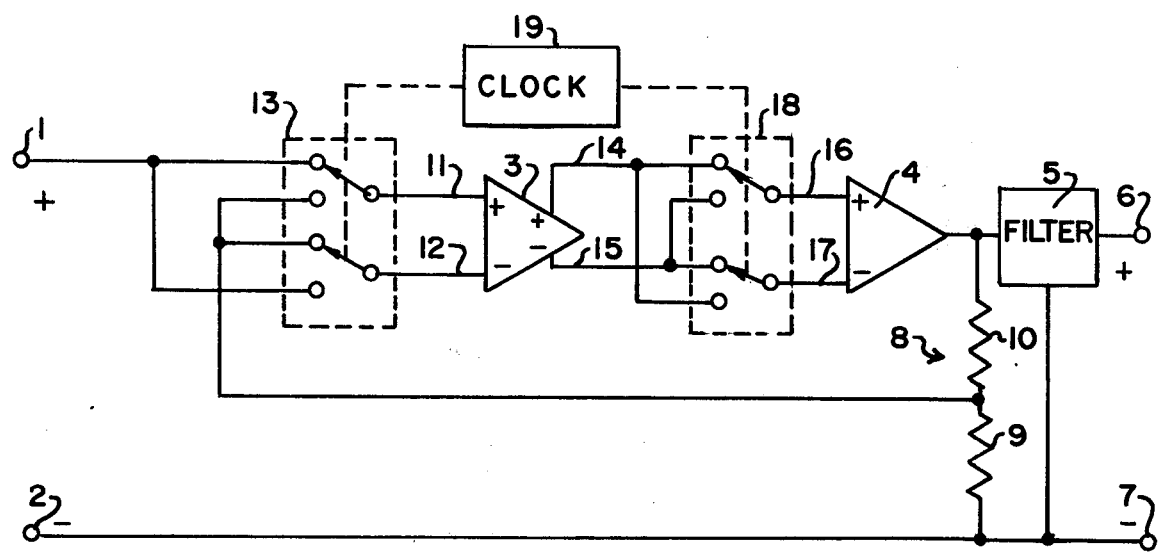
FIG. 1 is a block diagram of one embodiment of amplifier system of this invention.

Referring now to the drawings, FIG. 1 is a diagrammatic representation of a non-inverting operational amplifier system of the present invention. The system includes terminals 1 and 2 across which an input voltage is applied, a differential gain stage 3, an operational (differential) amplifier 4, a filter 5, and a pair of terminals 6 and 7 across which an output voltage is produced. A voltage divider 8 consisting of a first resistor 9 and a second resistor 10 provides a negative feedback path in accordance with standard operational amplifier design.

Connected to inputs 11 and 12 of the differential gain stage 3 is an electronic double pole, double throw switch 13. In a first position, shown in FIG. 1, the switch 13 connects the differential gain stage's first input 11 to the system's input terminal 1 and connects the differential gain stage's second input 12 to the voltage divider 8. In the second position of the switch 13, the input gain stage's first input 11 is connected to the voltage divider 8 and the input gain stage's second input 12 is connected to the system's input terminal 1.

Connected between differential outputs 14 and 15 of the differential gain stage 3 and inputs 16 and 17 of the operational amplifier 4 is a second double pole, double throw switch 18. In a first position, shown in FIG. 1, the switch 18 connects the operational amplifier's first input 16 to the first output 14 of the differential gain stage and connects the operational amplifier's second input 17 to the gain stage's second output 15. In the second position of the switch 18, the operational amplifier's first input 16 is connected to the second output 15 of the gain stage 3, and the operational amplifier's second input 17 is connected to the first output 14 of the differential gain stage.

A clock 19 is connected to the switches 13 and 18 and causes them to switch synchronously between their first position and their second position at a preselected repetition rate. The repetition rate is chosen to accomodate the expected rate of change of the input (information) voltage and to suit the characteristics of the gain stage 3, as discussed more fully hereinafter. The characteristics of the filter 5 likewise reflect the repetition rate chosen for the clock 19. The filter 5 is a low-pass filter which is chosen to have a cut-off, as measured by its -3dB roll-off frequency, well below the frequency of the clock 19, as also described more fully hereinafter.

When the switches 13 and 18 are in their first position, as shown in FIG. 1, the amplifier system operates as a standard non-inverting operational amplifier system. The transfer function for the amplifier system of FIG. 1 is given by:

$$V_O = (V_I - V_{os}) \frac{A(R1 + R2)}{((A + 1)R1) + R2}. \quad (1)$$

Where $V_O$ is the system's output voltage, $V_I$ is the input voltage, $V_{os}$ is the instantaneous offset voltage (referred to the input of the gain stage 3), A is the system's open loop gain, R1 is the resistance of the first resistor 9, and R2 is the resistance of the second resistor 10. If the gain A is very large (much larger than R2/R1) the transfer function may be approximated by:

$$(2) \quad V_O = (V_I - V_{os})(1 + (R2/R1)).$$

Amplifiers of this invention typically have a gain which is sufficiently high that the approximate formula (2) for the transfer function is quite accurate.

When the switches 13 and 18 are in their second position, the amplifier system again operates as a standard non-inverting operational amplifier system. However, the transfer function corresponding to formula (2) is:

$$(3) \quad V_O = (V_I + V_{os})(1 + R2/R1).$$

If the instantaneous offset voltage remains constant during a switching cycle, and if the operation of the clock 19 is symmetrical, the average output voltage is simply:

$$(4) \quad V_O = (V_I)(1 + (R2/R1)).$$

It will be seen that formula (4) represents an ideal amplifier with gain equal to $(1 + R2/R1)$.

Highly symmetrical clocks and switches are presently available. Thus, slowly changing offset signals produced by the amplifier system (amplifier offset and drift) are averaged out. The switching frequency is chosen to be low enough that the switching process does not introduce significant noise in the gain stage 3. On the other hand, it is chosen to be high enough that the filter 5 effectively averages the alternating offset signal and also high enough to cause low frequency noise to be largely cancelled during a switching cycle, thereby removing most 1/f noise. Noise components having frequencies $f_N$ (expressed in radians) much lower than the switching frequency $f_C = 1/(2T)$ and having peak-to-peak amplitude of $2V_N$ at the output of the amplifier with the clock off, have a maximum peak-to-peak amplitude of approximately $V_N$ $\pi f_N/f_C=2V_N\pi f_N T$ with the clock running. Thus, the maximum peak-to-peak amplitude of low frequency noise is reduced by a factor equal to the ratio of clock frequency to noise frequency times $2/\pi$. This implies that all noise can be eliminated by choosing a high enough frequency. However, the 1/f noise is the main noise component, and it cannot be reduced below the noise of the input stage operating at the clock frequency. Therefore, the clock frequency selected need not be much above the 1/f corner frequency of the input stage. For a gain stage 3 utilizing closely matched junction-type field effect transistors, which are inherently low-noise devices, a clock frequency on the order of 100–300 Hz is sufficient to remove most 1/f noise. The filter 5 is correspondingly chosen to have a −3dB roll-off frequency well below the clock frequency. The roll-off frequency may be about 10Hz, for example. If the gain stage 3 is fabricated of "noiser" components, such as metal oxide semiconductor transistors (e.g. MOSFETs) which have a higher 1/f corner frequency, a higher frequency clock is required to remove 1/f noise. A clock rate on the order of 1000 Hz or higher is preferred, and a filter 5 roll-off frequency of about 100 Hz is adequate. The performance of an amplifier system incorporating a relatively noisy MOS gain stage is of course not as good, in absolute terms, as a system utilizing low noise components, but its equivalent noise and offset represent an improvement of an order of magnitude over such a system with the clock 19 turned off. In either case, the amplifier system of FIG. 1 displays the long-term stability and thermal stability associated with chopper-stabilized amplifiers.

It may be noted that the amplifier system of FIG. 1 is simply a two stage direct coupled amplifier system in either position of the switches 13 and 18. Thus, the improved performance is obtained without capacitive coupling of the amplifier stages and without relying on a fed-back signal to provide correction of offset or drift as in the sample and hold amplifiers. No capacitor recovery time is required following an overload of the system although normal filter recovery time still exists. If the clock 19 should fail, the system continues to operate as a standard amplifier system. All of the components of the system are also easily fabricated on a semiconductor chip using known technology.

Figure 2:
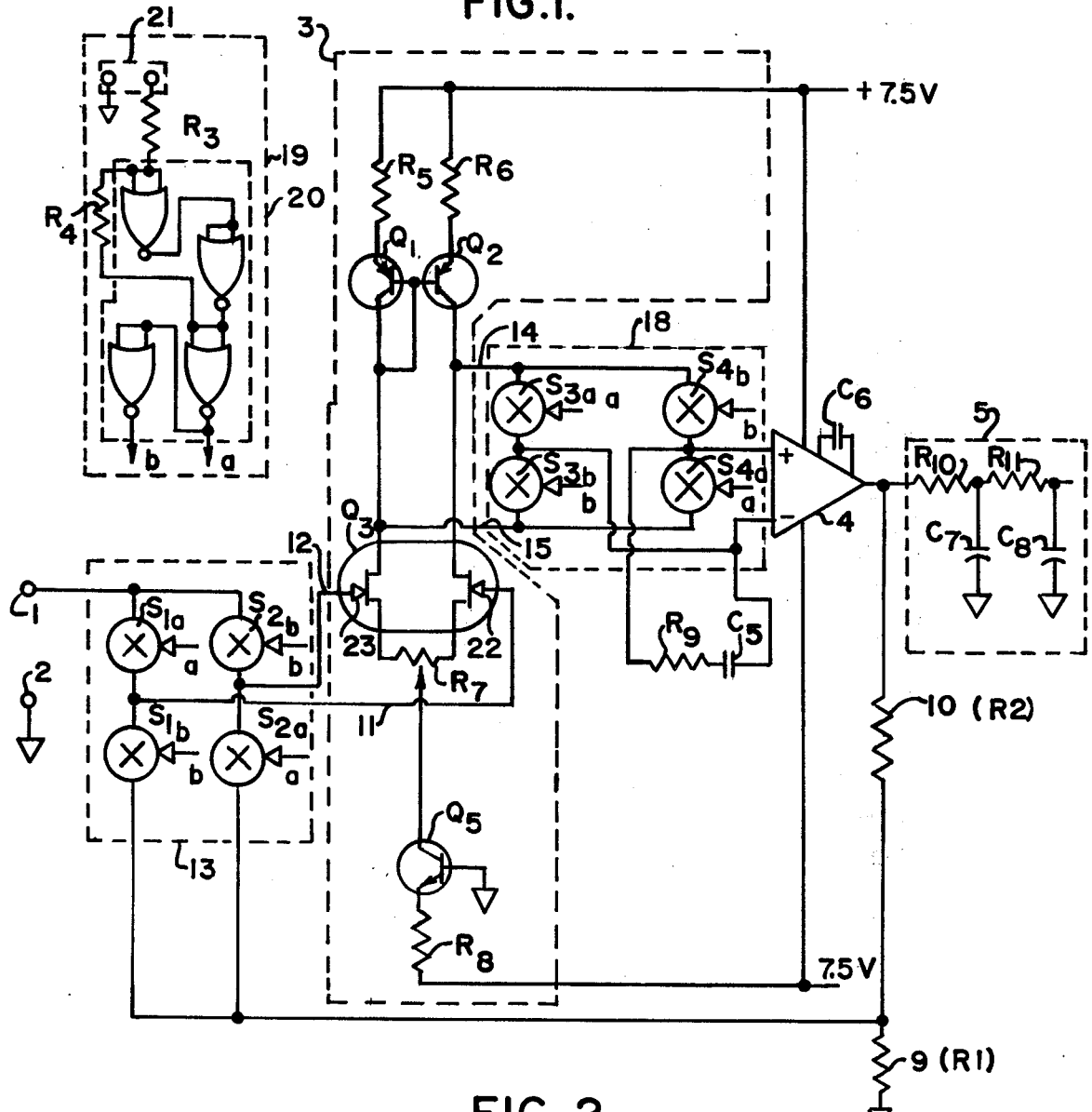
FIG. 2 is a circuit diagram of a preferred amplifier system of FIG. 1.

Referring now to FIG. 2 for a preferred implementation of the amplifier system of FIG. 1, it will be seen that one input terminal 2 of the system is grounded. The switches 13 and 18 are monolithic integrated circuit Quad Bilateral Switches, including electronic switches $S_{1a}$, $S_{2a}$, $S_{1b}$ and $S_{2b}$ and $S_{3a}$, $S_{4a}$, $S_{3b}$ and $S_{4b}$ respectively. The clock 19 is a metal oxide semiconductor (MOS) NOR gate 20, including external resistors R3 and R4, and an oscillator 21. The oscillator 21 may be a variable frequency external oscillator such as a Wavetek Model 130, or it may be a local oscillator (multivibrator) having a fixed frequency. The oscillator is operated at a repetition rate of 150 hertz. The clock 19 produces a positive signal at the points designated a during the entire negative half cycle of the oscillator 21 and produces a positive signal at the points marked b during the positive half cycle of the oscillator 21. The presence of a positive signal at a completes circuits through electronic switches $S_{1a}$, $S_{2a}$, $S_{3a}$ and $S_{4a}$. Likewise, the presence of a positive signal at b completes circuits through electronic switches $S_{1b}$, $S_{2b}$, $S_{3b}$ and $S_{4b}$.

The input amplifier or gain stage 3 is a conventional dual junction field effect transistor (JFET) amplifier having differential inputs and differential outputs, and having a gain of about one hundred. The gain stage 3 is powered by positive and negative 7.5 volt sources. Matched resistors R5 and R6 and matched bipolar transistors Q1 and Q2 form a current mirror for the matched field effect transistor pair Q3, the gates 22 and 23 of which are connected to the gain stage inputs 11 and 12 respectively. Potentiometer R7 permits the offset voltage of the gain stage 3 to be zeroed approximately, thereby reducing the amplitude of the square wave output signal which must be removed by the filter 5. Transistor Q5 and resistor R8, provide a constant current source on the negative side of the FET pair Q3. The differential outputs 14 and 15 of the gain stage 3 are connected between the transistor Q2 and the dual FET Q3 and between the transistor Q1 and the dual FET Q3 respectively.

Resistor R9 and capacitor C5 provide phase compensation for the first stage amplifier and thus prevent oscillation of the circuit. Capacitor C6 provides phase compensation for the operational amplifier 4.

The filter 5 includes resistors R10 and R11 and capacitors C7 and C8.

In the feed back path, the resistance values R1 and R2 of the voltage divider resistors 9 and 10 are chosen to give a total amplifier system gain of 1000.

The components of the circuit shown in FIG. 2 may, for example, have the following values:

| | |
|---|---|
| C5 | 100 picofarad |
| C6 | 33 picofarad |
| C7 | 2.2 microfarad |
| C8 | 2.2 microfarad |
| R1 | 100 ohm (wire wound) |
| R2 | 99.9K ohm (wire wound) |
| R3 | 10K ohm |
| R4 | 100K ohm |
| R5 | 2K ohm ± 1% |
| R6 | 2K ohm ± 1% |
| R7 | 100 ohm |
| R8 | 6.8K ohm |
| R9 | 1K ohm |
| R10 | 10K ohm |
| R11 | 10K ohm |
| Q1 | 2N4250 |
| Q2 | 2N4250 |
| Q3 | 2N5566 |
| Q5 | 2N3393 |
| op amp 4 | 301A |
| switch 13 | CD4016 |
| switch 18 | CD4016 |
| Nor gate 20 | CD4001 |

Although the non-inverting amplifier system of FIGS. 1 and 2, with its differential input, differential output gain stage is presently the preferred embodiment of the invention, the invention is capable of being used in numerous amplifier configurations. By way of example, the configurations of FIGS. 3 and 4 are now described, reference numerals corresponding to those of FIG. 1 being used.

Figure 3:
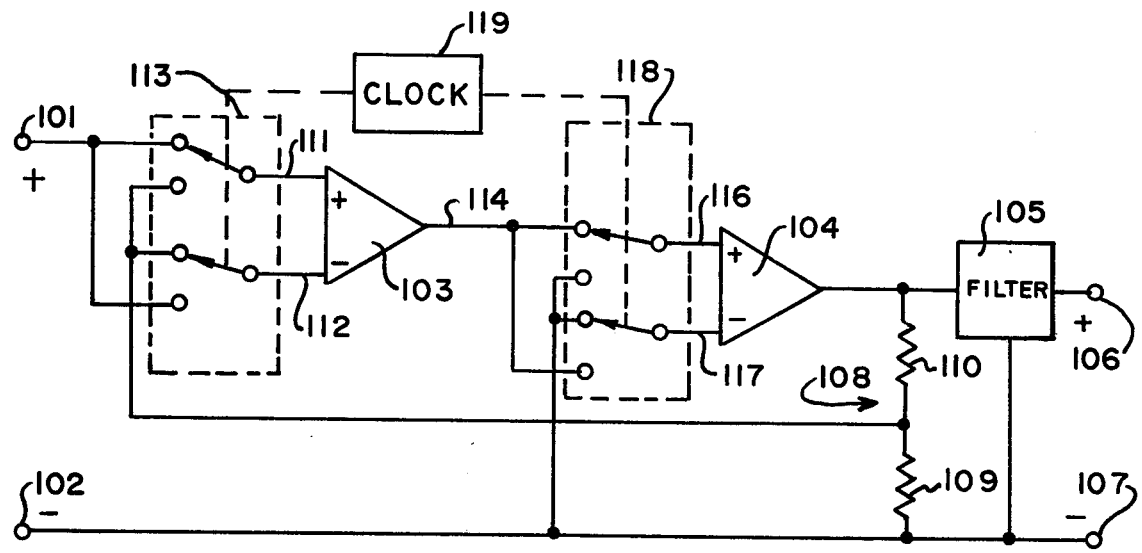
FIG. 3 is a block diagram of another embodiment of amplifier system of this invention.

In FIG. 3 is illustrated another non-inverting operational amplifier system. In this system an operational amplifier 103 having a single output replaces the differential output gain stage 3 of FIGS. 1 and 2. The output 114 of the operational amplifier gain stage 103 is therefore referenced to the common (negative or ground) of terminals 102 and 107, and this common voltage level is likewise the second input to second switch 118. The construction and operation of this embodiment is otherwise identical with that of FIG. 1.

Figure 4:
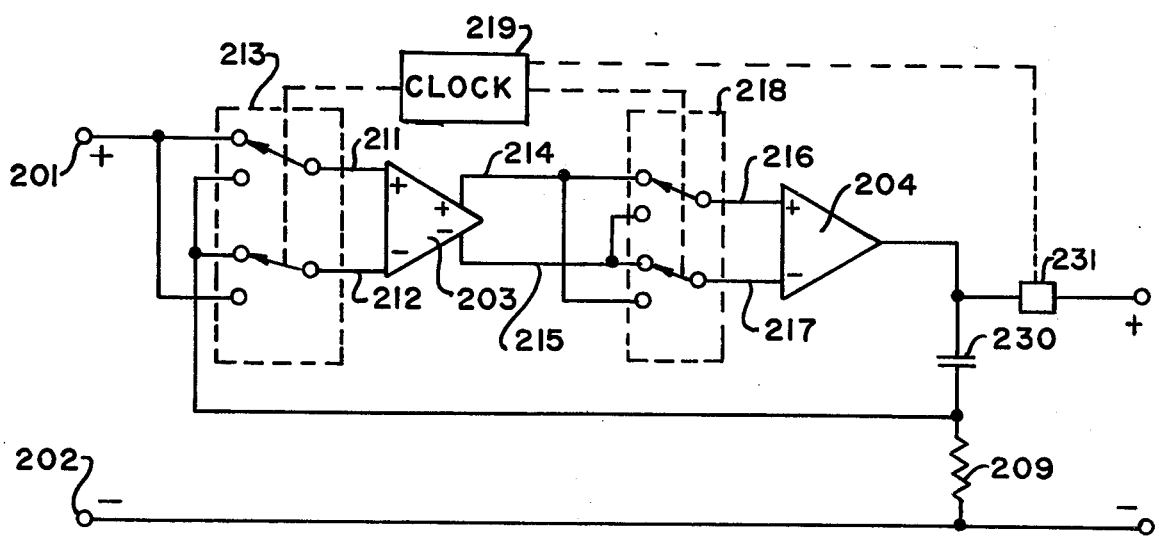
FIG. 4 is a block diagram of still another embodiment of amplifier system of this invention.

An integrator configuration of the present amplifier system is illustrated in FIG. 4. This configuration differs from the configuration of FIG. 1 primarily in the substitution of capacitor 230 for resistor 10 in the feed-back circuit and in the elimination of the filter 5. In this configuration, the capacitor 230 in the feedback path not only serves its standard function in an operational amplifier integrator circuit, but also rolls off high frequency noise (i.e., acts as a filter). The clock 219 and switches 213 and 218 again roll off low frequency noise, independent of the fed-back signal. To ensure that the integrator output reflects the same number of counts in each position of the switches 213 and 218, an electronic pulse counter 231 is connected into the output of the system, to permit an output signal only when the clock 219 has produced an even number of pulses since the capacitor 230 was last discharged.

Numerous variations in the amplifier system of this invention, within the scope of the appended claims, will occur to those skilled in the art in view of the foregoing disclosure. Merely by way of example, other operational amplifier configurations, such as inverting or differentiating configurations, may be employed.

I claim:

1. In an operational amplifier system including an amplifier having a pair of inputs and at least one output, a gain stage having a pair of inputs and a pair of outputs operatively connected to said inputs of said amplifier, and a feedback circuit connected between said output of said amplifier and one of the inputs of said gain stage, said operational amplifier system producing at said output of said amplifier an output signal proportional to the difference between the signals applied to said two inputs of said gain stage, said amplifier system also producing an unwanted output offset voltage signal and an unwanted output noise signal having a low frequency component, the improvement comprising means for reducing the portion of said output offset voltage signal and said noise signal produced by said gain stage, said means comprising
    A. first switch means between said outputs of said gain stage and said inputs of said amplifier for interchanging the inputs of said amplifier,
    B. second switch means for interchanging the inputs of said gain stage, and
    C. clock means for synchronously operating said first switch means and said second switch means at a predetermined clocking frequency thereby maintaining the relative phasing of the signal applied to the two inputs of said gain stage and the output signal across the inputs of said amplifier and periodically reversing the polarity of the gain stage portion of the offset voltage signal and the gain stage portion of the low frequency component of the noise signal for equal periods.

2. The improvement of claim 1 wherein said two outputs of said gain stage means comprise an output terminal on said gain stage and a constant reference voltage.

3. The improvement of claim 1 wherein said clocking frequency is substantially greater than the frequency of said low-frequency noise component.

4. The improvement of claim 3 wherein said gain stage is constructed of low noise components and said clocking frequency is between one hundred and one thousand hertz.

5. The improvement of claim 1 further including filter means, operatively connected to said output of said amplifier, for removing noise having a frequency above a 3-dB roll-off frequency, said roll-off frequency being substantially less than said clocking frequency.

6. The improvement of claim 5 wherein said clocking frequency is substantially greater than the frequency of said low-frequency noise component.

7. The improvement of claim 6 wherein said clocking frequency is between about 10 hertz and about 10,000 hertz.

8. The improvement of claim 1 wherein said feedback circuit includes voltage dividing means, the gain of said amplifier system being determined by said voltage dividing means.

9. The improvement of claim 1 wherein said feedback circuit includes a capacitor, said amplifier system being an integrator.

10. The improvement of claim 9 further including means for producing an output signal from said amplifier system only after said clock means have operated an even number of times.

11. In a direct coupled amplifier system for receiving an input signal and producing an output signal, said amplifier system including amplifier means having two inputs and two outputs, said amplifier means producing across said two outputs an output signal proportional to the difference between the signals applied to said two inputs, said amplifier means also producing an unwanted offset voltage signal and an unwanted noise signal having a low frequency component, the improvement comprising means for reducing said offset voltage signal and said low frequency noise signal component comprising:
    A. first switch means for interchanging the outputs of said amplifier means,
    B. second switch means for interchanging the inputs of said amplifier means, and
    C. clock means for synchronously operating said first switch means and said second switch means at a predetermined clocking frequency thereby maintaining the relative phasing of the input signal and the output signal and periodically reversing the polarity of the offset voltage signal and the low frequency component of the noise signal for equal periods.

12. The improvement of claim 11 wherein said clocking frequency is substantially greater than the frequency of said low-frequency noise component.

13. The improvement of claim 12 further including filter means for removing noise having a frequency above a 3-dB roll-off frequency, said roll-off frequency being substantially less than said clocking frequency.

14. The improvement of claim 12 wherein said clocking frequency is between about 10 hertz and about 10,000 hertz.

15. The improvement of claim 12 wherein said two outputs of said amplifier means comprise an output terminal on said amplifier means and a constant reference voltage.

* * * * *